US005358886A

United States Patent [19]
Yee et al.

[11] Patent Number: 5,358,886
[45] Date of Patent: Oct. 25, 1994

[54] METHOD OF MAKING INTEGRATED CIRCUIT STRUCTURE WITH PROGRAMMABLE CONDUCTIVE ELECTRODE/INTERCONNECT MATERIAL

[75] Inventors: Abraham Yee, Santa Clara; Stanley Yeh, Fremont; Tim Carmichael, San Jose; Gobi Padmanabhan, Sunnyvale, all of Calif.

[73] Assignee: LSI Logic Corporation, Milpitas, Calif.

[21] Appl. No.: 86,487

[22] Filed: Jul. 1, 1993

[51] Int. Cl.⁵ .......................................... H01L 21/265
[52] U.S. Cl. ..................................... 437/49; 437/50; 437/193; 437/200
[58] Field of Search ................ 437/193, 47, 52, 60, 437/34, 43, 45, 48, 49, 200, 50; 257/390, 391, 314

[56] References Cited
U.S. PATENT DOCUMENTS

| | | | |
|---|---|---|---|
| 4,319,396 | 3/1982 | Law et al. | 437/48 |
| 4,345,365 | 8/1982 | Carrigan | 437/49 |
| 4,561,168 | 12/1985 | Pitzer et al. | 29/571 |
| 4,677,735 | 7/1987 | Malhi | 29/571 |
| 4,753,896 | 6/1988 | Matloubian | 437/29 |
| 4,804,636 | 2/1989 | Groover, III et al. | 437/52 |
| 5,010,032 | 4/1991 | Tang et al. | 437/57 |
| 5,034,348 | 7/1991 | Hartswick et al. | 437/200 |
| 5,256,894 | 10/1993 | Shino | 437/200 |

FOREIGN PATENT DOCUMENTS

| | | |
|---|---|---|
| 59-35465 | 2/1984 | Japan . |
| 1-164062 | 6/1989 | Japan . |
| 3-21015 | 1/1991 | Japan . |

OTHER PUBLICATIONS
Weste, Neil H., et al., *Principles of CMOS VLSI Design: A Systems Perspective*, Reading, Mass.: Addison-Wesley Publishing Company, pp. 58-60, 76-80, and 86-89 (Date Unknown).

*Primary Examiner*—Olik Chaudhuri
*Assistant Examiner*—H. Jey Tsai
*Attorney, Agent, or Firm*—John P. Taylor

[57] ABSTRACT

An integrated circuit structure, and a method of making same is disclosed wherein one or more patternable busses of conductive material (such as polysilicon) interconnect electrode strips (such as gate electrode strips) of the same conductive material formed over active areas (such as MOS islands). The busses are formed on the structure over field oxide portions thereon during the initial step of patterning the layer of conductive material to expose the active areas and to form the electrodes thereover. After further processing to form other electrode regions in the active areas (e.g., source and drain regions in N-MOS and P-MOS islands), but prior to formation of an insulation layer over the structure for formation of a metal layer thereon, the busses are subjected to a further patterning step to form custom interconnections, as desired, between various electrodes in the integrated circuit structure. By forming such busses during the initial patterning step to form a genetic structure, and then providing a second patterning step, wherein custom interconnections are formed in the layer of conductive material between electrodes of various active devices, some of the custom interconnections to form specific electrical circuits, formerly implemented at the metal layer level, can be eliminated, thereby reducing the total number of contacts formed between the electrodes and the metal layer or layers, as well as simplifying the metal wiring needed to form the desired electrical circuit.

19 Claims, 3 Drawing Sheets

METHOD OF MAKING INTEGRATED CIRCUIT STRUCTURE WITH PROGRAMMABLE CONDUCTIVE ELECTRODE/INTERCONNECT MATERIAL

BACKGROUND OF THE INVENTION

1. Field of the Invention

This invention relates to integrated circuit structures formed on semiconductor wafers. More particularly, this invention relates to integrated circuit structures having conductive interconnections formed between the electrodes of transistors at the electrode level, and a method of making same.

2. Description of the Related Art

In the conventional prior an production of integrated circuit structures such as, for example, gate array MOS structures, as illustrated in prior art FIGS. 1A, 1B, and 2, a silicon wafer 2 is masked, after formation of P-wells and/or N-wells, to define the areas or islands 10 where one or more MOS transistors will be formed, e.g., P-islands and N-islands. Field oxide 14 is then grown on the unmasked portions of wafer 2 to isolate each MOS island 10 from adjacent islands 10 or other devices on wafer 2.

After removal of the field oxide mask, a thin gate oxide layer is grown over the silicon wafer and a polysilicon layer is then deposited over the wafer from which the gate electrodes will be formed. The polysilicon layer is patterned to form single polysilicon strips 20 which comprise one or more gates in a single MOS island 10 and contact pad or "dogbone" areas 28 which extend over the field oxide 14 which surrounds that particular MOS island 10.

Source and drain regions 30 and 32 are then formed in MOS islands 10 by appropriate doping. A self-aligned silicide (salicide) layer (not shown) may then be formed over polysilicon strips 20. A layer of insulation 36, such as an oxide layer, is then formed over the structure and appropriate planarizing may then be carried out.

At this point in the conventional process, as shown in FIG. 1A, what has been formed is a genetic structure wherein the MOS device or devices beneath each polysilicon strip 20, i.e, the MOS device or devices for which polysilicon strip 20 comprises the gate electrode(s), is electrically independent from any other MOS transistors formed beneath other polysilicon strips in other islands or other wells, although electrically coupled through source/drain 32 to the adjacent strip (or strips) 20 in the same island.

Alternatively, as shown in FIG. 1B, pairs of N channel and P channel transistors in adjacent islands may be connected together in single pairs respectively by strips 20'a and 20'b. The pairs are electrically isolated from pairs in other islands, but as in FIG. 1A, the respective transistors in the pair may be electrically coupled through source/drain 32 to the adjacent strip (or strips) in the same island.

In either instance, it has become a practice, with many integrated circuit chip or die manufacturers, to form such genetic structures (usually referred to as "gate arrays") in high volume, and then to use such an inventory of partially prefabricated integrated circuit structures or "gate arrays" for the subsequent production of custom dies, i.e., integrated circuit dies with specific and specialized electrical circuitry implemented in the silicon chip by subsequently customizing the interconnections between the array of independent and unconnected MOS, bipolar, MOS/bipolar, or other active device structures formed by the genetic structure.

Depending upon the desired electrical circuitry to then be implemented in the genetic integrated circuit structure, these various electrically isolated transistors are then connected or "wired" together by formation of a wiring harness comprising one or more patterned metal layers or strips 40 formed over previously deposited insulation layer 36, with further insulation layers formed between the patterned metal layers, when more than one patterned metal layer is used.

As shown particularly in FIG. 2, the formation of such connections between the illustrated MOS gate electrodes aim involves formation of contacts or holes 50 through insulation layer 36 from metal strips 40 to each of the polysilicon contact pads 28 and as well as the filling of each such contact hole 50 with a conductive material 54 to provide the necessary electrical path between polysilicon contact pad 28 and patterned metal layer 40.

Due to the complexity of such wiring, and the need for crossover wiring, it is often necessary to provide two and even three such patterned metal layers, i.e., metal strips, to achieve the desired electrical connections between the various active devices such as the illustrated MOS devices on wafer 2. Since each such contact opening made between polysilicon contact pads 28 and the overlying metal strips 40, or vias formed between metal layers, can result in failures due to misalignment, underetching, overetching, or improper filling of the contact or via opening, an increased number of such contacts and layers of wiring strips can have a negative impact on the overall yield of chips or dies from the semiconductor wafer.

It would, therefore, be desirable if at least some of the electrical interconnections between various active devices on a substrate (i.e., MOS, bipolar, or other active devices) could be carried out in a manner which would reduce the number of contacts needed between the electrodes of conductive material and the metal harness, as well as possibly eliminating the need for at least one metal wiring layer, when multiple metal wiring layers are used to form the wiring harness, and while still permitting the initial formation of a genetic gate array type structure capable of being subsequently electrically connected together to form a variety of different electrical circuits.

SUMMARY OF THE INVENTION

It is, therefore, an object of this invention to provide an integrated circuit structure, and method of making same, comprising a bus structure of conductive material interconnecting electrodes of a plurality of active devices and formed using the same layer of conductive material used to form such electrodes, whereby at least some of the subsequent custom electrical connections formed between such active devices may be fabricated by a subsequent patterning of the bus of conductive material initially formed.

The invention comprises an integrated circuit structure having one or more busses formed of conductive material interconnecting conductive electrodes, such as, for example, gate electrodes in MOS devices, and preferably formed on the structure over field oxide portions thereon during the initial step of patterning the conductive material to expose the P islands and/or N islands and to form conductive electrodes thereover. After further processing to form other electrode regions such as, for example, the source and drain regions in MOS islands, but prior to formation of an insulation layer over the structure for formation of a metal layer thereon, the busses of conductive material are subjected to a further patterning step to form custom interconnections, as desired, between various electrodes in the integrated circuit structure previously all connected to the busses.

By forming such busses of conductive material during the initial step of patterning the conductive material to form a genetic structure, and then providing a second patterning step, wherein custom interconnections are formed in the layer of conductive material, i.e., the busses, between electrodes of various active devices, some of the custom interconnections to form specific electrical circuits, formerly implemented at the metal wiring layer level, can be eliminated, thereby reducing the total number of contacts formed between the electrodes and the metal wiring layer or layers, as well as simplifying the metal wiring needed to form the desired electrical circuit.

DETAILED DESCRIPTION OF THE INVENTION

The invention comprises an integrated circuit structure, and a method of making same, wherein one or more busses, formed of conductive material, consecutively interconnect a plurality of conductive electrodes. The busses are preferably formed on the structure over field oxide portions thereon during the initial step of patterning the conductive material to expose the P islands and/or N islands and to form conductive electrodes thereover. After further processing to form other electrode regions such as, for example, the source and drain regions in MOS islands, but prior to formation of an insulation layer over the structure for formation of a metal layer thereon, the busses of conductive material are subjected to a further patterning step to form custom interconnections, as desired, between various electrodes in the integrated circuit structure previously all connected to the busses.

By use of the term "conductive material" is meant an electrically conductive material such as a conductive metal, polysilicon, a germanium-silicon material, or a silicide such as a refractory metal silicide, e.g., titanium silicide. By way of illustration, and not of limitation, the conductive material used to form the structure of the invention will hereinafter be referred to as polysilicon, it being understood that other conductive material may be used in place of polysilicon when desired or needed.

It should be noted that while the invention will hereinafter be described with respect to the interconnection of gate electrodes of MOS devices, by way of illustration and not of limitation, the invention is equally applicable to "gate arrays" of bipolar devices, e.g., with emitters interconnected; or combinations of MOS/bipolar devices; or any other types of active devices.

Figure 3:
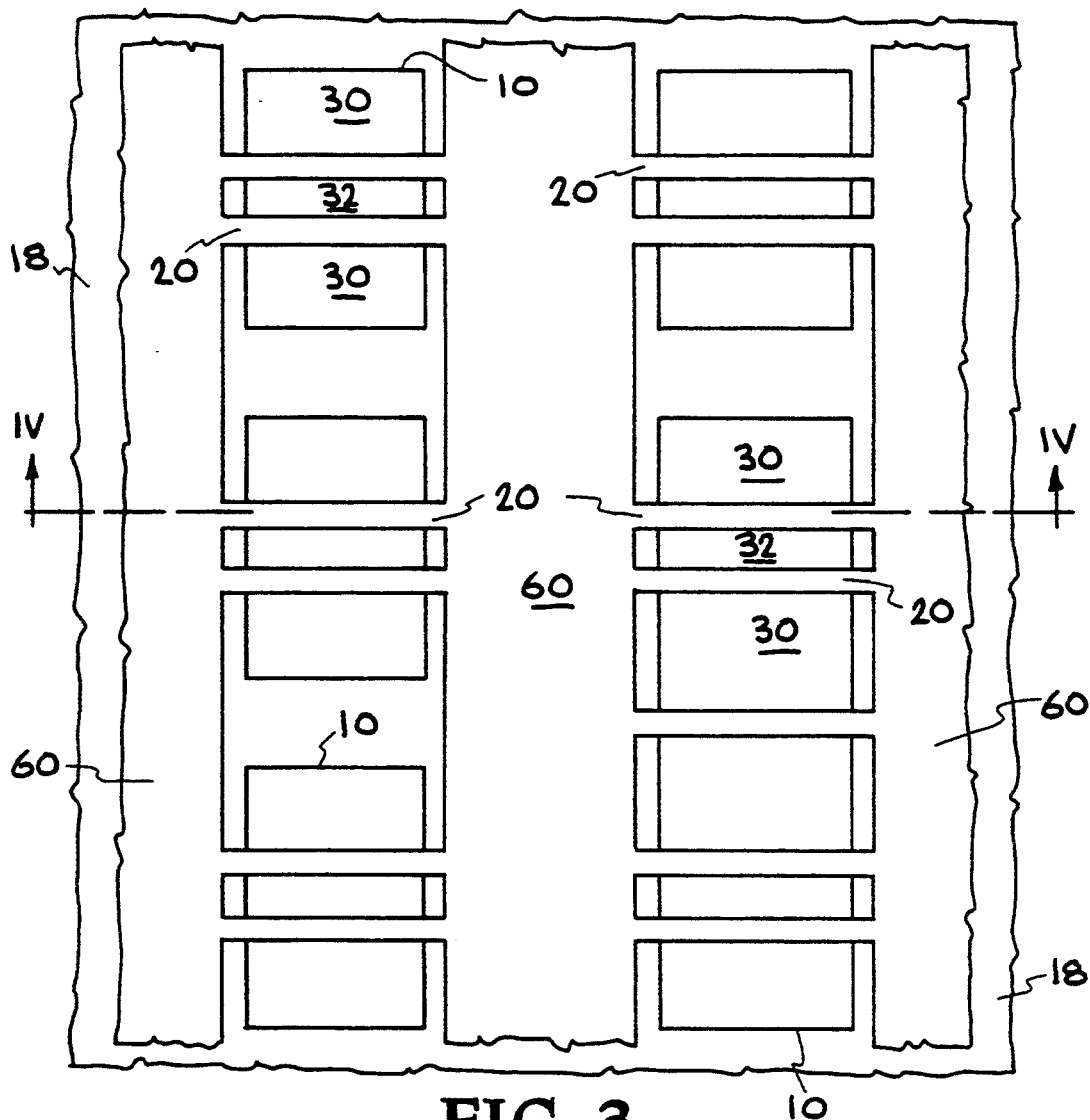
FIG. 3 is a fragmentary top view of the structure of the invention, showing busses of conductive material formed over the field oxide between the MOS islands.
Figure 4:
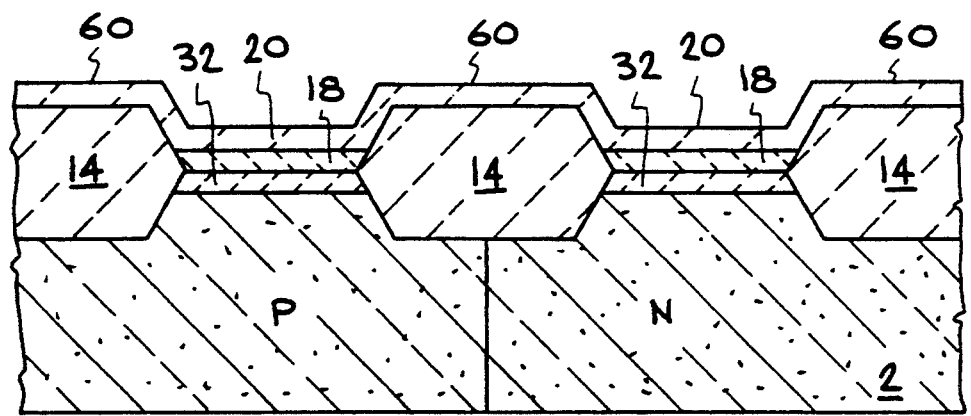
FIG. 4 is a fragmentary side section view of the structure of FIG. 3, taken along lines IV—IV to show the continuous bus of conductive material formed between the conductive strips over adjacent MOS islands.

Referring now to FIGS. 3 and 4, the integrated circuit structure of the invention is illustrated comprising bus structures 60 of conductive material formed over field oxide 14 on a semiconductor wafer 2 and interconnecting gate electrode strips 20 over MOS islands or active areas 10 in which source regions 30 and drain regions 32 are formed.

As shown in FIGS. 3 and 4, polysilicon bus structure 60 is initially connected to all of the polysilicon gate electrode strips 20 formed over all of the MOS islands 10. Polysilicon bus structure 60 and polysilicon strips 20 are formed by patterning a single layer of polysilicon. This polysilicon layer is formed on wafer 2 after wafer 2 has been masked to permit growth of field oxide 14 which surrounds each MOS island 10, followed by removal of the mask and formation of a gate oxide layer over the portions of wafer 2 exposed by removal of the field oxide mask.

It should be noted that polysilicon bus 60 is illustrated and described as being formed over a field oxide (14) which is grown on unmasked portions of a masked silicon wafer. However, the polysilicon bus structure of the invention could be constructed over other isolation structures such as, for example, grooves or trenches formed in wafer 2 and then filled with insulation material to electrically isolate each MOS island from adjacent MOS islands.

As is well known to those skilled in the art, devices of the same type within each island may be isolated from one another by turned off gates, commonly referred to as "gate isolation", which are also initially connected to the busses.

After the polysilicon layer has been patterned to form polysilicon bus 60 and polysilicon gate electrode strips 20, the exposed portions of the MOS islands are doped to form source and drain regions 30 and 32.

The MOS islands may reside in N-wells or P-wells and, therefore, may be appropriately doped to form source and drain regions for either PMOS or NMOS transistors, it being understood that the polysilicon bus structure of the invention is equally applicable to either type of integrated circuit structure, or combinations of adjacent PMOS and NMOS devices to form CMOS structures interconnected together by the polysilicon bus or busses of the invention.

After formation of source/drain regions 30 and 32 in MOS islands 10, a silicide layer (not shown) may be formed over the initially patterned polysilicon by depositing a layer of a metal such as, for example, titanium capable of reacting with silicon to form the corresponding metal silicide, e.g., titanium silicide, sometimes referred to as "salicide" or self-aligned silicide. Alternatively the silicide layer may be formed after the subsequent patterning of polysilicon busses 60 to form the custom interconnections or wiring, that is, the genetic gate array structure may be stored or inventoried for future use prior to formation of the metal silicide layer thereon.

When the silicide layer is formed prior to storage, the unreacted metal, i.e., metal not over silicon, may be selectively removed after the silicide step. Alternatively, wafer 2, containing the generic MOS devices formed thereon, may be stored in this condition, with the unreacted metal subsequently removed when the remainder of the wafer processing, i.e., the customizing of the wafer is to be performed.

In some instances, it may be desired to deposit a CVD nitride or oxide layer over the structure, either before or after forming the silicide layer, as a protective layer which would then be etched off prior to the subsequent custom patterning of the gate array.

Figure 5:
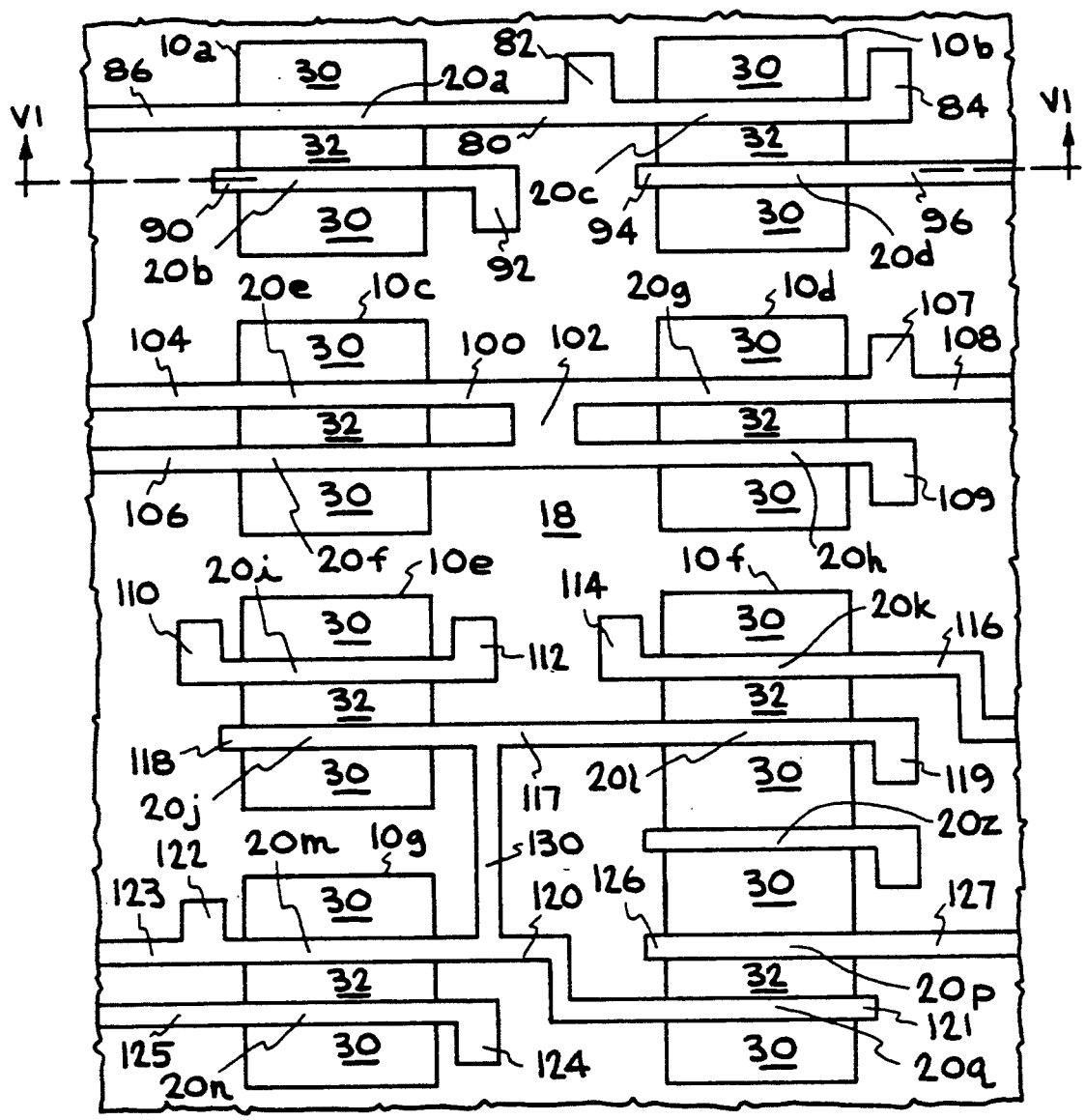
FIG. 5 is a fragmentary top view illustrating a typical patterning configuration after the bus of conductive material of the invention has been patterned to implement a particular electrical circuit.
Figure 6:
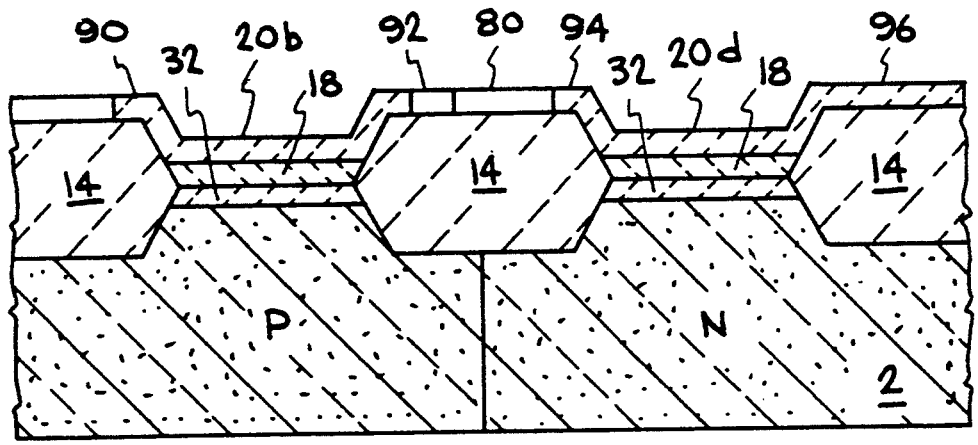
FIG. 6 is a fragmentary side section view of a portion of the structure of FIG. 5, taken along lines VI—VI.

Turning now to FIGS. 5 and 6, the use and advantages of the polysilicon bus during subsequent customized processing of the integrated circuit structure will now be described. It will be understood, however, that the patterned structure illustrated in FIGS. 5 and 6 is only for purposes of illustrating the various patterns which can be formed to show the flexibility permitted by the invention.

As best seen in FIG. 5, polysilicon bus 60 has now been masked and etched, i.e., patterned, to form a number of interconnect structures to at least partially implement, at the polysilicon level, the desired connection of the individual MOS devices together to form the desired electrical circuit or structure, e.g., such as a NAND gate or a NOR gate, etc.

In FIG. 5, polysilicon gate electrode strip 20a, in MOS island 10a, is shown as connected by polysilicon strip 80 to polysilicon gate electrode strip 20c in MOS island 10b, i.e., those MOS transistors respectively formed in MOS islands 10a and 10b using polysilicon gate electrode strips 20a and 20c are now electrically connected together. A polysilicon contact pad 82 is shown formed between MOS islands 10a and 10b and connected to polysilicon strip 80, while a second contact pad 84 is shown on the right electrically connected to polysilicon strip 20c. Polysilicon contact pads 82 and 84 permit vertical interconnections to be made to a metal layer to, for example, permit the just described MOS transistors formed in MOS islands 10a and 10b to be connected to other areas of the integrated circuit structure through such an overlying metal layer. Polysilicon strip 86, also connected to polysilicon gate electrode strip 20a, serves to interconnect the just described MOS transistors in MOS islands 10a and 10b with other devices to the left of the portion of the integrated circuit structure illustrated in FIG. 5.

Still referring to MOS island 10a and 10b, it will be noted that polysilicon gate electrode strip 20b is not connected to polysilicon gate electrode strip 20d. Rather polysilicon gate electrode strip 20b is provided with a simple termination 90 on one end and a contact pad 92 at the opposite end. Polysilicon gate electrode strip 20d is also provided with a simple termination 94 at one end and a continuation portion 96, at its opposite end, to connect the MOS transistor(s), formed using polysilicon strip 20d as their gate electrode, to other devices on the integrated circuit structure. It will be noted that the patterned portions of polysilicon bus 60 (in FIG. 3) which are respectively connected to polysilicon gate electrode strips 20b and 20d (FIG. 5) are also shown in the side section view of FIG. 6, with portions of polysilicon strip 90 also visible.

Continuing to MOS islands 10c and 10d, it will be noted that polysilicon gate electrode strips 20e, 20f, 20g, and 20h have all been connected together by polysilicon portion 100 which includes a contact pad 102 to permit vertical connection to a metal layer as well for further electrical connection to other portions of the integrated circuit structure. Strips 20e, 20f, and 20g are shown, respectively, as continuing at 104, 106, and 108, while strips 20g and 20h ate respectively shown connected to contacts pads 107 and 109.

In MOS island 10e, polysilicon gate electrode strip 20i is shown formed with a contact pad 110 at one end and another contact pad 112 at its opposite end, representing the traditional prior art "dogbone" construction for all of the polysilicon electrode strips. Polysilicon gate electrode strip 20k over MOS island 10f is shown formed with contact pad 114 at one end and a fragmentary portion 116 of a connection on its opposite end to another device or structure which is not directly aligned with it, as will be discussed below with respect to the interconnection between strips 20m and 20q.

Polysilicon gate electrode strips 20j and 20l, formed respectively over MOS islands 10e and 10f, are shown as connected together by polysilicon strip 117, with strip 20j terminating, at its opposite end, at 118, and strip 20l terminating, at its opposite end, in a contact pad 119.

Polysilicon gate electrode strip 20m, formed over MOS island 10g, is connected to polysilicon gate electrode strip 20q over MOS island 10f by a dog-leg shaped polysilicon strip 120. Strip 120 is also shown connected to strip 117 by a cross strip 130. Polysilicon gate electrode strip 20m, at its opposite end, is connected to contact pad 122 and extension 123, while polysilicon gate electrode strip 20q, at its opposite end, is terminated at 121.

Polysilicon gate electrode strip 20n over MOS island 10g is provided with an extension 125 at one end and a contact pad 124 at its opposite end. Polysilicon gate electrode strip 20p is provided with a termination 126 at one end and a contact pad 127 at its opposite end. MOS island 10f is further shown with a gate isolation formed using strip 20z which separates gate strip 20l from gate strip 20p.

Figure 1A:
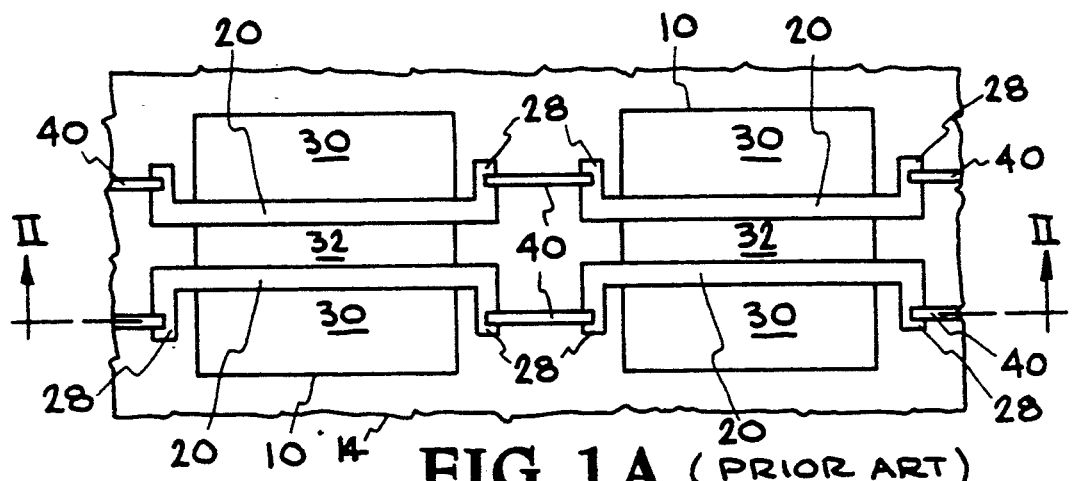
FIG. 1A is a fragmentary top view of a prior art structure, showing the metal strips used to interconnect individual gate electrode strips formed over MOS islands.
Figure 1B:
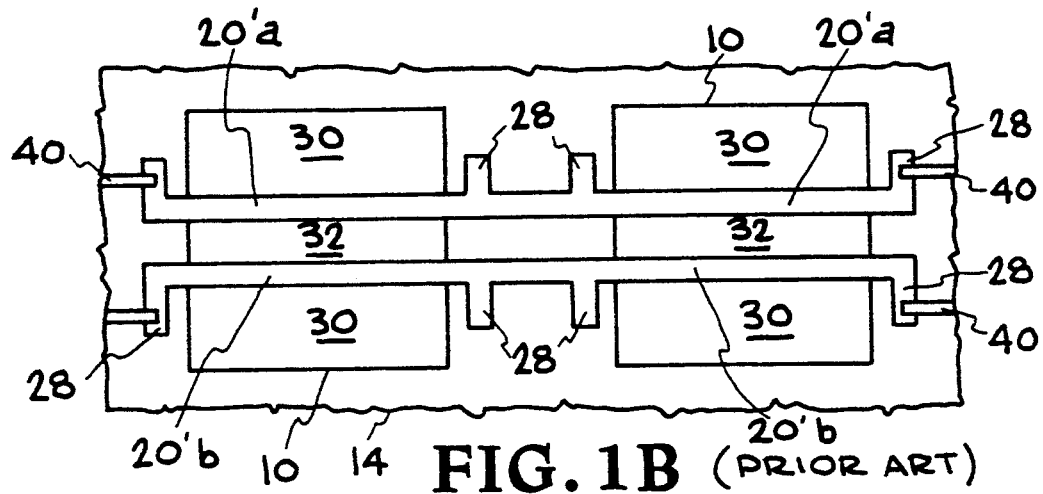
FIG. 1B is a fragmentary top view of another type of prior art structure, showing individual gate electrode strips, respectively formed over P islands and N islands, connected together in pairs.
Figure 2:
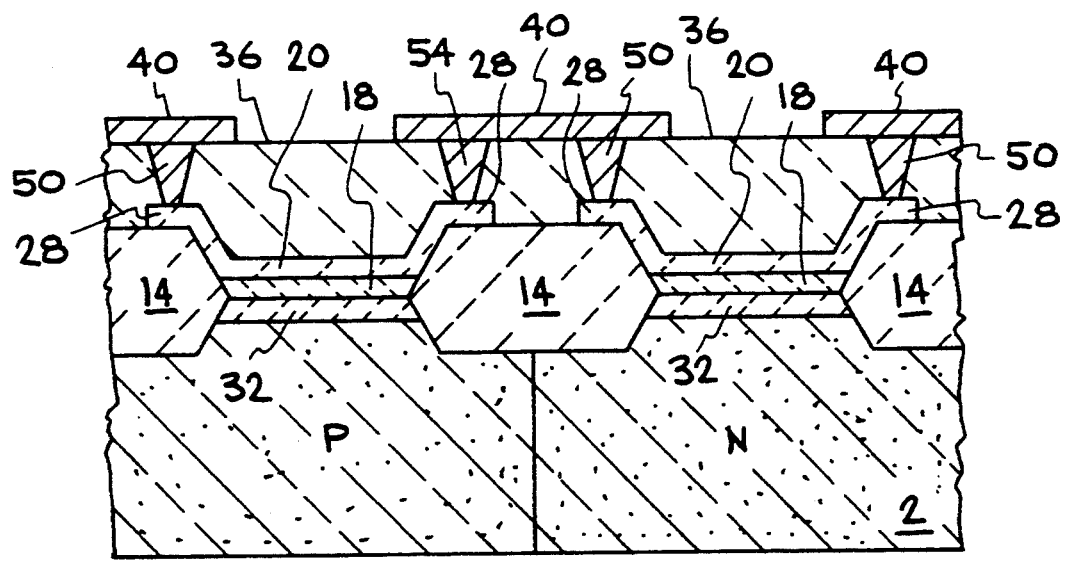
FIG. 2 is a fragmentary side section view of the prior art structure shown in FIG. 1A taken along lines II—II.

Thus, in comparing the various configurations shown in FIG. 5 (and FIG. 6), and comparing these with the repeating "dogbone" configuration of the prior an shown in FIGS. 1 and 2, it can be seen that the initial provision of polysilicon bus members 60, in accordance with the invention and as depicted in FIGS. 3 and 4, permits the initial formation of a genetic gate array integrated circuit structure with the same degree of flexibility as in the prior art "dogbone" genetic gate array structure. However, unlike the prior an "dogbone" structure of FIGS. 1 and 2, the genetic gate array structure of the invention, provided with one or more polysilicon bus structures 60, permits a large mount of the subsequent custom wiring of the gate array (to provide specific circuitry) to be carried out at the polysilicon level, i.e., without using overlying metal layers.

Such subsequent use of the same polysilicon layer used to form the gate electrodes to aim provide some of the interconnects has a number of advantages, including first of all, a reduction in the number of contact openings between the polysilicon contact pads and overlying metal layers. Such a reduction of contact openings should increase the yield since failures may occur due to misregistry of the contact openings, under etching, over etching, and improper filling of the contact opening with conductive material. Furthermore, providing some of the interconnects at the polysilicon level reduces the mount of metal wiring needed which can, in turn, reduce the complexity of the metal wiring, as well as, in some cases, even reduce the number of metal wiring levels needed.

Thus, although it is recognized that the structure and method of the invention results in an additional patterning operation for the polysilicon layer used to initially form the gate electrodes, it is believed that the additional steps to be performed in the additional patterning of polysilicon bus 60 are more than compensated for by the above discussed advantages which flow from the practice of the invention.

Having thus described the invention what is claimed is:

1. A process of making an integrated circuit structure on a semiconductor wafer wherein said structure may be partially formed with a plurality of electrodes of conductive material interconnected together by busses of the same conductive material formed between said electrodes to initially form a genetic structure which may then be customized for specific circuitry which comprises:
   a) forming an array of active areas on said wafer by forming a pattern of insulation surrounding each active area;
   b) forming a layer of conductive material over said wafer;
   c) patterning said layer of conductive material to form:
      i) one or more electrode strips over each of said active areas; and
      ii) busses over said insulation and connected to each end of each of said electrode strips to be subsequently customized; and
   d) then subsequently further patterning busses in a separate step to form interconnections, terminations, and contact pads for said electrode strips to thereby customize said integrated circuit structure;
   whereby at least a portion of the interconnections between said electrode strips are made at the same level as said electrode strips by said subsequent patterning of said busses formed from the same conductive material as said electrode strips.

2. The process of claim 1 including the further step of forming other electrode regions in said active areas adjacent said electrode strips.

3. The process of claim 1 wherein said step of forming said layer of conductive material over said wafer further comprises forming a layer of conductive material selected from the group consisting of metal, polysilicon, a germanium-silicon material, and a metal silicide.

4. The process of claim 1 wherein said step of forming said layer of conductive material over said wafer further comprises forming a layer of polysilicon on said wafer.

5. The process of claim 4 including the further step of forming a silicide layer over said polysilicon gate electrode strips and said polysilicon busses.

6. The process of claim 5 wherein said further step of forming a silicide layer over said polysilicon gate electrode strips and said polysilicon busses is carried out prior to formation of an oxide layer on the surface of said silicide.

7. A process of making an MOS type integrated circuit structure on a semiconductor wafer wherein said structure may be partially formed with a plurality of gate electrodes formed from a patterned layer of conductive material interconnected together by busses formed from the same patterned layer of conductive material formed between said electrodes to initially form a genetic interconnected structure at the same level which may then be customized for specific circuitry which comprises:
   a) forming an array of MOS islands on said wafer by forming a pattern of insulation surrounding each island;
   b) forming a layer of conductive material over said wafer;
   c) patterning said layer of conductive material to form:
      i) one or more gate electrode strips over each of said MOS islands; and
      ii) busses over said insulation and connected to each end of each of said gate electrode strips to be subsequently customized; and
   d) then subsequently patterning said busses in a separate step to form interconnections for at least wine of said electrode strips to thereby customize said integrated circuit structure;
   whereby at least a portion of the interconnections between said gate electrode strips are made at the same level as said electrode strips by subsequent patterning of said busses formed from the same conductive material.

8. The process of claim 7 including the further step of forming a gate oxide layer over said MOS islands prior to said step of forming said layer of conductive material thereon.

9. The process of claim 8 wherein said step of forming said layer of conductive material over said wafer further comprises forming a layer of conductive material selected from the group consisting of metal, polysilicon, a germanium-silicon material, and a metal silicide.

10. The process of claim 7 wherein said step of forming said layer of conductive material over said wafer further comprises forming a layer of polysilicon on said wafer.

11. The process of claim 10 including the further step of forming a silicide layer over said polysilicon gate electrode strips and said polysilicon busses.

12. The process of claim 11 wherein said further step of forming a silicide layer over said polysilicon gate electrode strips and said polysilicon busses is carried out prior to formation of an oxide layer on the surface of said silicide.

13. A process of making a gate array MOS type integrated circuit structure comprising a plurality of MOS devices on a semiconductor wafer with a plurality of gate electrodes formed from a patterned layer of conductive material and electrically interconnected together by patternable busses at the gate electrode level formed from the same patterned layer of conductive material and subsequently patterned a second time to form circuitry which comprises:
   a) forming an may of MOS islands on said wafer and forming a pattern of insulation surrounding each island on said wafer;
   b) forming a layer of conductive material over said wafer;
   c) patterning said layer of conductive material to form:

i) one or more gate electrode strips over each of said MOS islands and extending beyond said islands and over portions of said insulation surrounding said islands; and ii) busses over said insulation and connected to each end of each of said gate electrode strips to be subsequently customized; and d) then subsequently further patterning said busses in a separate step to form interconnections, terminations, and contact pads for said gate electrode strips to thereby customize said integrated circuit structure;

whereby at least a portion of the interconnections between said gate electrode strips are made at the same level as said gate electrode strips by said subsequent patterning of said busses formed from the same conductive layer.

14. The process of claim 13 including the further step of forming source/drain electrode regions in those portions of said active areas not covered by said electrode strips.

15. The process of claim 13 wherein said step of forming said layer of conductive material over said wafer further comprises forming a layer of conductive material selected from the group consisting of metal, polysilicon, a germanium-silicon material, and a metal silicide.

16. The process of claim 13 wherein said step of forming said layer of conductive material over said wafer further comprises forming a layer of polysilicon on said wafer.

17. The process of claim 16 including the further step of forming a silicide layer over said polysilicon gate electrode strips and said polysilicon busses.

18. The process of claim 17 wherein said further step of forming a silicide layer over said polysilicon gate electrode strips and said polysilicon busses is carried out prior to formation of an oxide layer on the surface of said silicide.

19. A process of making a gate array MOS type integrated circuit structure comprising a plurality of MOS devices on a semiconductor wafer with a plurality of gate electrodes formed from a patterned layer of conductive material and electrically interconnected together by patternable busses at the gate electrode level formed from the same patterned layer of conductive material and subsequently patterned a second time to form circuitry which comprises:

a) forming an array of MOS islands on said wafer by masking portions of said wafers where said islands will be formed and forming a pattern of insulation surrounding each island in the unmasked portions of said wafer;

b) forming a layer of conductive material over said wafer selected from the group consisting of metal, polysilicon, a germanium-silicon material, and a metal silicide;

c) patterning said layer of conductive material to form:

i) one or more gate electrode strips over each of said MOS islands and extending beyond said islands and over portions of said insulation surrounding said islands; and ii) busses over said insulation and connected to each end of each of said gate electrode strips to be subsequently customized;

d) forming source/drain regions in those portions of said MOS islands not covered by said gate electrode strips; and e) then subsequently further patterning said busses in a separate step to form interconnections, terminations, and contact pads for said gate electrode strips to thereby customize said integrated circuit structure;

whereby at least a portion of the interconnections between said gate electrode strips are made at the same level as said gate electrode strips by said subsequent patterning of said busses formed from the same conductive layer.

* * * * *

UNITED STATES PATENT AND TRADEMARK OFFICE
CERTIFICATE OF CORRECTION

PATENT NO. : 5,358,886

DATED : October 25, 1994

INVENTOR(S) : Abraham Yee, Stanley Yeh, Tim Carmichael, and Gobi Padmanabhan It is certified that error appears in the above-identified patent and that said Letters Patent is hereby corrected as shown below:

Title page, item [57], col. 2,
Abstract, line 19, change "genetic" to "generic".
Column 1, line 42, change "genetic" to "generic".
Column 1, line 61, change "genetic" to "generic".
Column 2, line 2, change "genetic" to "generic".
Column 2, line 5, change "genetic" to "generic".
Column 2, line 46, change "genetic" to "generic".
Column 3, line 13, change "genetic" to "generic".
Column 5, line 3, change "genetic" to "generic".
Column 6, line 53, change "genetic" to "generic".
Column 6, line 55, change "genetic" to "generic".
Column 6, line 57, change "genetic" to "generic".
Column 7,
Claim 1, line 25, change "genetic" to "generic".
Column 8,
Claim 7, line 8, change "genetic" to "generic".

Signed and Sealed this

Third Day of January, 1995

Attest:

BRUCE LEHMAN

*Attesting Officer*     *Commissioner of Patents and Trademarks*

UNITED STATES PATENT AND TRADEMARK OFFICE
CERTIFICATE OF CORRECTION

PATENT NO. : 5,358,886

DATED : October 25, 1994

INVENTOR(S) : Abraham Yee, Stanley Yeh, Tim Carmichael, and Gobi Padmanabhan

Page 1 of 2

It is certified that error appears in the above-indentified patent and that said Letters Patent is hereby corrected as shown below:

Title page:
item [57], col. 2, Abstract, Line 19, change "genetic" to "generic".

Column 1, line 42, change "genetic" to "generic".

Column 1, line 61, change "genetic" to "generic".

Column 2, line 2, change "genetic" to "generic".

Column 2, line 5, change "genetic" to "generic".

Column 2, line 46, change "genetic" to "generic".

Column 3, line 13, change "genetic" to "generic".

Column 5, line 3, change "genetic" to "generic".

Column 6, line 53, change "genetic" to "generic".

Column 6, line 55, change "genetic" to "generic".

Column 6, line 57, change "genetic" to "generic".

Column 7, line 25, claim 1, change "genetic" to "generic".

UNITED STATES PATENT AND TRADEMARK OFFICE
CERTIFICATE OF CORRECTION

PATENT NO. : 5,358,886
DATED : October 25, 1994
INVENTOR(S) : Abraham Yee, Stanley Yeh, Tim Carmichael, and Gobi Padmanabhan It is certified that error appears in the above-indentified patent and that said Letters Patent is hereby corrected as shown below:

Column 8, line 8, claim 7, change "genetic" to "generic".
This certificate supersedes Certificate of Correction issued January 3, 1995.

Signed and Sealed this

Twenty-eight Day of February, 1995

Attest:

BRUCE LEHMAN

Attesting Officer

Commissioner of Patents and Trademarks